United States Patent
Vert et al.

(10) Patent No.: US 8,536,617 B2
(45) Date of Patent: Sep. 17, 2013

(54) OPTICALLY TRIGGERED SEMICONDUCTOR DEVICE AND METHOD FOR MAKING THE SAME

(75) Inventors: Alexey Vert, Niskayuna, NY (US); Ahmed Elasser, Niskayuna, NY (US); Arthur Stephen Daley, Niskayuna, NY (US); Stanislav I Soloviev, Niskayuna, NY (US); Peter Almern Losee, Niskayuna, NY (US)

(73) Assignee: General Electric Company, Niskayuna, NY (US)

(*) Notice: Subject to any disclaimer, the term of this patent is extended or adjusted under 35 U.S.C. 154(b) by 87 days.

(21) Appl. No.: 13/328,796

(22) Filed: Dec. 16, 2011

(65) Prior Publication Data
US 2013/0153953 A1 Jun. 20, 2013

(51) Int. Cl.
*H01L 31/101* (2006.01)
(52) U.S. Cl.
USPC .......................................... 257/115; 257/114
(58) Field of Classification Search
USPC .................................. 257/114, 115
See application file for complete search history.

(56) References Cited

U.S. PATENT DOCUMENTS

| | | | | | |
|---|---|---|---|---|---|
| 3,567,972 | A | * | 3/1971 | Faust ............................. | 327/514 |
| 3,641,404 | A | * | 2/1972 | Per ................................ | 257/109 |
| 3,893,153 | A | * | 7/1975 | Page et al. .................... | 257/115 |
| 4,053,922 | A | * | 10/1977 | Ferro ............................ | 257/115 |
| 4,122,480 | A | * | 10/1978 | Silber et al. .................. | 257/118 |
| 4,595,939 | A | * | 6/1986 | Yamaguchi et al. .......... | 257/115 |
| 4,604,638 | A | * | 8/1986 | Matsuda ....................... | 257/132 |
| 4,613,884 | A | * | 9/1986 | Angerstein et al. ........... | 257/115 |
| 4,633,288 | A | * | 12/1986 | Herberg ........................ | 257/114 |
| 4,649,410 | A | * | 3/1987 | Ohashi ......................... | 257/115 |
| 4,717,947 | A | * | 1/1988 | Matsuda et al. .............. | 257/115 |
| 4,739,387 | A | * | 4/1988 | Temple et al. ................ | 257/115 |
| 4,908,687 | A | * | 3/1990 | Temple ......................... | 257/115 |
| 4,975,755 | A | * | 12/1990 | Nishizawa .................... | 257/114 |
| 5,017,991 | A | * | 5/1991 | Nishizawa et al. ........... | 257/114 |
| 5,345,094 | A | * | 9/1994 | Usui et al. .................... | 257/113 |

(Continued)

FOREIGN PATENT DOCUMENTS

EP 0743687 A2 11/1996
JP 10027899 1/1998

(Continued)

OTHER PUBLICATIONS

Weitzel, C. E. "Silicon carbide high-power devices" Elec. Dev. IEEE trans. on, Oct. 1996 pp. 1732-1741.*

(Continued)

*Primary Examiner* — N Drew Richards
*Assistant Examiner* — Grant Withers
(74) *Attorney, Agent, or Firm* — Penny A. Clarke (57) ABSTRACT

A thyristor device includes a semiconductor body and a conductive anode. The semiconductor body has a plurality of doped layers forming a plurality of dopant junctions and includes an optical thyristor, a first amplifying thyristor, and a switching thyristor. The conductive anode is disposed on a first side of the semiconductor body. The optical thyristor is configured to receive incident radiation to generate a first electric current, and the first amplifying thyristor is configured to increase the first electric current from the optical thyristor to at least a threshold current. The switching thyristor switches to the conducting state in order to conduct a second electric current from the anode and through the semiconductor body.

19 Claims, 7 Drawing Sheets

(56) References Cited

U.S. PATENT DOCUMENTS

| | | | |
|---|---|---|---|
| 5,637,886 A * | 6/1997 | Satoh et al. | 257/107 |
| 5,804,841 A * | 9/1998 | Satoh et al. | 257/117 |
| 6,703,642 B1 | 3/2004 | Shah | |
| 7,072,196 B1 | 7/2006 | Glidden et al. | |
| 7,696,528 B2 * | 4/2010 | Kellner-Werdehausen et al. | 257/107 |
| 2006/0261348 A1 | 11/2006 | Ryu et al. | |
| 2007/0051972 A1 * | 3/2007 | Schulze et al. | 257/115 |
| 2009/0026967 A1 | 1/2009 | Mazumder et al. | |
| 2009/0206677 A1 | 8/2009 | Kuplin | |
| 2010/0283529 A1 | 11/2010 | Zhang et al. | |
| 2012/0098029 A1 * | 4/2012 | Mazumder | 257/115 |
| 2012/0319133 A1 * | 12/2012 | Zhang | 257/77 |

FOREIGN PATENT DOCUMENTS

| | | |
|---|---|---|
| JP | 10027899 A | 1/1998 |
| WO | 2007149846 A2 | 12/2007 |
| WO | WO 2007149846 (A2) | 12/2007 |

OTHER PUBLICATIONS

Temple, V. A. K. "High-power dual amplifying gate light triggered thyristors" Elec. Dev. IEEE trans on, Aug. 1976 pp. 893-898.*

Dheilly, N "Optical triggering of SiC thyristors using UV LEDs" Elec. Let. vol. 47 Iss. 7 Mar. 31, 2011 pp. 459-460.

Dheilly et al., "Optical triggering of SiC thyristors using UV LEDs", Electronics Letters, pp. 459-460, vol. 47, Issue: 7, ISSN: 0013-5194, Mar. 31, 2011.

* cited by examiner

OPTICALLY TRIGGERED SEMICONDUCTOR DEVICE AND METHOD FOR MAKING THE SAME

BACKGROUND

Thyristor devices, such as silicon controlled rectifiers (SCRs), may be used as electronic switches in a variety of applications, including, but not limited to power converters, motor drives, pulse power, and the like. In a typical operation, when no electric current (or an insufficient current) is injected into a gate terminal of the thyristor device, then the thyristor device may be in an OFF or blocking state with no current flowing between anode and cathode terminals of the thyristor device. When a sufficient electric current (e.g., above a designated threshold) is injected into the gate terminal, the thyristor device can switch from the OFF state to an ON state, or a conducting state, and the electric current from the anode terminal is conducted through a gate layer and a drift layer of the thyristor device to the cathode terminal.

A class of thyristor devices called light triggered thyristors can be optically switched to the conductive state by applying light to the gate pad which then generates an electric current, through a photodiode effect, which is injected into the thyristor gate. The light-generated current can be supplied to the gate terminal to switch the device to the conducting state. Using a light source to switch the state of the thyristor device can be useful in many high voltage applications because the light source can be isolated from the thyristor terminals (anode or cathode). This is beneficial because the gate terminal is decoupled from the high voltage terminals (anode or cathode), and can allow multiple devices to be strung (e.g., connected) in series without additional circuitry. Additionally, the gating of many thyristors in a series or parallel string may occur simultaneously and accurately.

However, in some high voltage applications requiring kilovolts, and/or very high anode-cathode currents, the gate current required to turn-on the thyristor devices can be significant (e.g., a few amperes). This current level may be much larger than what can typically be generated by existing light sources. As a result, the use of optically controlled thyristor devices may be limited to lower voltage and current applications. It would be beneficial to have a thyristor that is optically triggered and that can operate in high voltage, high current applications.

BRIEF DESCRIPTION

In one embodiment, a device (e.g., a thyristor device) is provided. The device includes a semiconductor body and a conductive anode. The semiconductor body has a plurality of doped layers forming a plurality of dopant junctions and includes an optical thyristor, a first amplifying thyristor, and a switching thyristor. The conductive anode is disposed on a first side of the semiconductor body. The optical thyristor is configured to receive incident radiation to generate a first electric current, and the first amplifying thyristor is configured to increase the first electric current from the optical thyristor to at least a threshold current. The switching thyristor switches to the conducting state in order to conduct a second electric current from the anode and through the semiconductor body.

In another embodiment, a method (e.g., a method for providing a thyristor device) providing a semiconductor body extending between opposite first and second sides. The semiconductor body includes doped layers that form first and second dopant junctions located between the first and second sides. The method also includes removing a first portion of a first layer of the doped layers that is disposed along the first side of the semiconductor body to expose a second layer of the doped layers. The first portion of the first layer is removed to provide an activation portion of the semiconductor body that receives incident radiation to generate electric current in an optical thyristor of the semiconductor body. The method further includes removing a second portion of the first layer of the doped layers to expose the second layer in an intermediate portion of the semiconductor body. The intermediate portion is disposed between an amplifying thyristor and a switching thyristor of the semiconductor body. The method also includes conductively coupling a conductive terminal between the first layer in the amplifying thyristor of the semiconductor body and the second layer that is exposed in the intermediate portion and conductively coupling an anode to the first layer of the doped layers and a cathode to the doped layers at the second side of the semiconductor body.

In another embodiment, a device (e.g., a thyristor device) includes an optical thyristor, an amplifying thyristor, and a switching thyristor. The optical thyristor is configured to generate electric current when exposed to light. The amplifying thyristor has a first gate and is configured to switch to the conducting state when the first gate receives at least a first threshold current. The switching thyristor has a second gate and is coupled with an anode and a cathode. The switching thyristor is configured to switch to the conducting state when the second gate receives at least a second threshold current. The optical thyristor is configured to generate electric current for the second gate that exceeds the first threshold current of the amplifying thyristor and the amplifying thyristor is configured to increase the electric current such that the electric current exceeds the second threshold current of the switching thyristor and is provided to the second gate.

BRIEF DESCRIPTION OF THE DRAWINGS

The present inventive subject matter will be better understood from reading the following description of non-limiting embodiments, with reference to the attached drawings, wherein below.

DETAILED DESCRIPTION

Reference will be made below in detail to example embodiments of the inventive subject matter, examples of which are illustrated in the accompanying drawings. Wherever possible, the same reference numerals used throughout the drawings refer to the same or like parts. At least one embodiment described herein provides for an optically triggered thyristor device that may be used as a switch to control the flow of relatively high voltages and currents. While the discussion provides examples of materials that may be used to form the thyristor device, alternatively, one or more other materials may be used.

Figure 1:
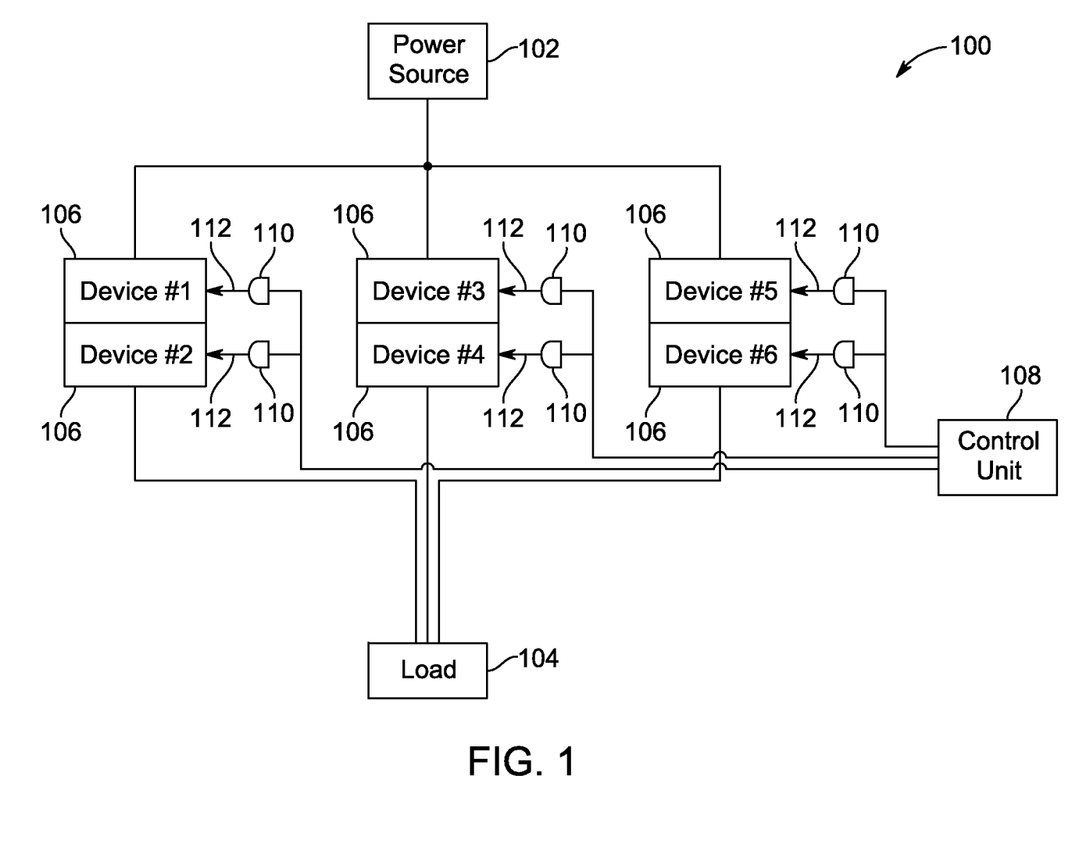
FIG. 1 is a schematic diagram of one embodiment of a switching system.

FIG. 1 is a schematic diagram of one embodiment of a switching system 100. The switching system 100 may be used to convert direct current from a power source 102 (e.g., a photovoltaic device, battery, and the like) to alternating current for an electric load 104 (e.g., a power grid or other device, system, or apparatus that uses the alternating current to perform work). The switching system 100 includes a plurality thyristor devices 106 ("Device #1," "Device #2," "Device #3," "Device #4," "Device #5, and "Device #6") that are conductively coupled with the power source 102 and/or the load 104. The devices 106 are communicatively coupled (e.g., coupled by one or more wired and/or wireless connections) with a control unit 108. The control unit 108 can include a processor, controller, or other logic-based device that automatically switches or is manually controlled to trigger the devices 106. The devices 106 are turned-on to permit the direct current to flow through the devices 106. The devices 106 are turned-off to block the current from flowing through the devices 106.

The control unit 108 can control the timing of when each of the devices 106 is opened or closed to convert the direct current into a three phase alternating current that is delivered to the load 104. For example, the control unit 108 can close different combinations of the thyristor devices 106 to provide different phases of the three phase alternating current to the load 104.

In the illustrated embodiment, the control unit 108 controls the devices 106 by directing radiation sources 110 to emit radiation 112 toward the devices 106. While the discussion herein focuses on light sources, such as light emitting diodes (LEDs), being the sources 110 and light, such as ultraviolet light or another type or wavelength of light, being the radiation 112, other sources of light and/or other radiation may be used. Not all embodiments described herein are limited to light sources that emit light.

To close a device 106, the control unit 108 may direct the source 110 associated with the device 106 to turn on and generate light 112 toward the device 106. The light 112 generates a current in a gate of the device 106, and turns the device 106 on. As a result, the direct current from the power source 102 can flow through the corresponding device 106.

The direct-current voltage source 102 that supplies the devices 106 may be a high voltage source on the order of tens of kilovolts. In another embodiment, one or more of the thyristor devices 106 may be used in another system, such as a system that controls the flow of direct or alternating current, to a direct or alternating current load using one or more of the thyristor devices 106. Not all embodiments described herein are intended to be limited to using the thyristor device 106 as a switching mechanism that is used to convert direct current into alternating current.

Figure 2:
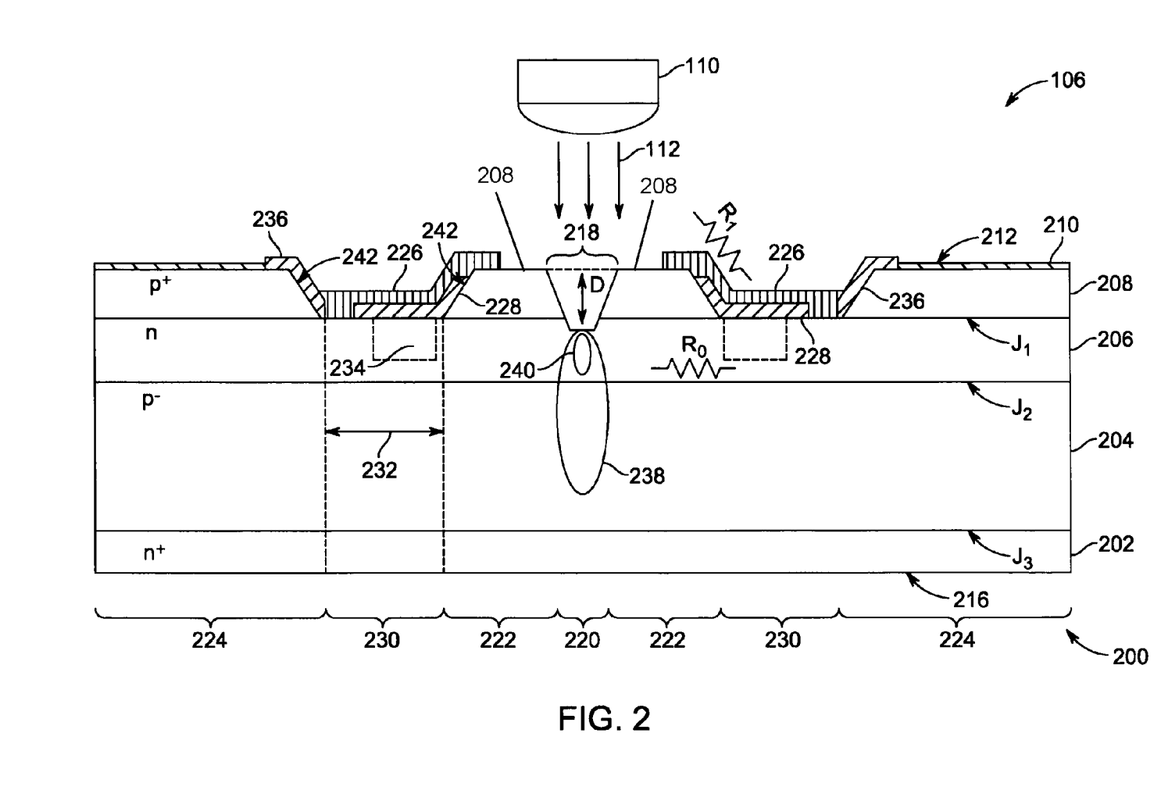
FIG. 2 is a cross-sectional view of one embodiment of a thyristor device shown in FIG. 1.

FIG. 2 is a cross-sectional view of one embodiment of the thyristor device 106. The thyristor device 106 includes a semiconductor body 200 having or formed from several alternating doped layers 202, 204, 206, 208. In one embodiment, the semiconductor body 200 is formed from silicon carbide (SiC). Alternatively, a different material may be used. The doped layers can include a first layer 202 that may be an n-doped layer (e.g., a layer doped with an n-type dopant such as phosphorus), a second layer 204 that may be a p-doped layer (e.g., a layer doped with a p-type dopant such as boron), a third layer 206 that may be an n-doped layer, and a fourth layer 208 that may be a p-doped layer. Alternatively, the first layer 202 may be a p-doped layer, the second layer 204 may be an n-doped layer, the third layer 206 may be a p-doped layer, and the fourth layer 208 may be an n-doped layer. In one embodiment, the fourth layer 208 is more heavily doped with the corresponding dopant (e.g., a p-type dopant) than the second layer 204. The first layer 202 may be more heavily doped with the corresponding dopant (e.g., an n-type dopant) than the third layer 206.

A conductive anode terminal 210 is deposited on a first side 212 of the semiconductor body 200. In one embodiment, the first layer 202 serves as a cathode terminal of the device 106. Alternatively, a conductive layer or terminal may be deposited an opposite, second side 216 of the semiconductor body 200 and serve as a conductive cathode terminal. The anode terminal 210 may be conductively coupled with a power source, such as the power source 102 (shown in FIG. 1). The conductive may be conductively coupled with a load, such as the load 104 (shown in FIG. 1). Alternatively, the anode terminal 210 may be conductively coupled with the load 104 while the cathode is conductively coupled with the power source 102.

The layers 202, 204, 206, 208 of the semiconductor body 200 form an amplifying gate thyristor that is optically triggered. For example, the thyristor device 106 is shown as a four-layer (p-n-p-n) structure having first and second terminals (e.g., anode and cathode) and that conducts current between the terminals when a current or signal is applied to a third terminal of the thyristor device 106. The thyristor device 106 can be effectively divided into several such four layer structures, such as a first optical thyristor 220, an amplifying thyristor 222, and a switching thyristor 224. The thyristors 220, 222, 224 are electrically coupled in parallel with each other, as described below. For example, the structures 220, 222, 224 may represent thyristors that are electrically coupled in parallel with each other.

In the illustrated embodiment, the thyristors 222, 224 are symmetric in the body 200 as the thyristors 222, 224 are disposed on opposite sides of the optical thyristor 220. As described below, the thyristor device 106 may be formed as a cylindrical-shaped device with the optical thyristor 220 disposed at or near the center or core of the cylindrical-shaped device and the thyristors 222, 224 circumferentially surrounding the optical thyristor 220 at different radial distances from the optical thyristor 220 or otherwise disposed outside of the optical thyristor 220. Alternatively, the thyristors 222, 224 may not be disposed symmetrically around the optical thyristor 220. For example, one or more the thyristors 222, 224 may be disposed only on one side of the optical thyristor 220.

In contrast to the other thyristors 222, 224, the optical thyristor 220 may not include the fourth layer 208, as shown in FIG. 2. The thyristors 222, 224 include the layers 202, 204, 206, 208 in the illustrated embodiment. As shown in FIG. 2, the thyristors 220, 222, 224 include several dopant junctions (e.g., p-n junctions) at the interfaces between the layers 202, 204, 206, 208. For example, the thyristors 220, 222, 224 include a first junction ($J_1$) at the interface between the layers 206, 208, a second junction ($J_2$) at the interface between the layers 204, 206, and a third junction ($J_3$) at the interface between the layers 202, 204.

In one embodiment, the thyristors 222, 224 may be considered as two coupled transistors, with at least two junctions (e.g., the first and second junctions) of each thyristor 222, 224 forming collector and emitter junctions, respectively, of a first transistor and the second and third junctions forming the collector and emitter junctions, respectively, of a second transistor that is conductively coupled with the first transistor. In the illustrated embodiment, fourth layer 208 is the collector region, the third layer 206 is the base region, and the second layer 204 is the emitter region of the first transistor. With respect to the second transistor, the third layer 206 is the collector region, the second layer 204 is the base region, and the first layer 202 is the emitter region. The third layer 206 can act as the base region of the first transistor and the collector region of the second transistor. The second layer 204 can act as the emitter region of the second transistor and the base region of the second transistor.

In operation, the layers 202, 204, 206, 208 may not permit current to flow from the anode terminal 210 to the cathode (e.g., the first layer or a conductive layer disposed on the second side 216 of the semiconductor body 200) when no electric charge or current is applied to one or more of the layers 204, 206 in the thyristors 220, 222, 224. When a sufficiently large electric charge or current is applied to at least one of the layers 204, 206 (such as the second layer 204), the charge or current allows current to flow from the fourth layer 208 to the first layer 202 through the layers 204, 206. For example, the third layer 206 may be referred to as a gate that receives an activation signal to turn the thyristor 220, 222, or 224 to an ON state to allow current to flow through the thyristor 220, 222, 224. Alternatively, the second layer 204 may act as the gate for one or more of the thyristors 220, 222, 224. When sufficient current is applied to the gate, the thyristor 220, 222, and/or 224 may switch from a blocking, or OFF state, to a conducting, or ON state.

For example, a negative current applied to the third layer 206 can cause holes (e.g., positive charge, such as the absence of an electron) to flow into the second layer 204. A voltage that is applied across the fourth and first layers 208, 202 injects electrons from the first layer 202 to the second layer 204. This added supply of holes and injection of electrons initiates transistor action in the second transistor (e.g., the layers 202, 204, 206 of a thyristor 220, 222, 224). Electrons from the first layer 202 eventually diffuse into the third layer 206. This diffusion of electrons causes an increase in holes established across the layers 202, 204, 206, 208, which permits current to flow through the entirety of the layers 202, 204, 206, 208 in the thyristor 220, 222, 224.

As shown in FIG. 2, no conductive terminal is directly coupled with the layer 206 of the optical thyristor 220. Instead, radiation 112 (e.g., light) from the radiation source 110 (e.g., an LED) is used to provide the activation signal that is applied to the gate (e.g., the second layer 204) of the optical thyristor 220. The radiation 112 is received through an activation portion 218 of the optical thyristor 220. The radiation 112 can be absorbed by the semiconductor body 200 in one or more radiation or light absorption regions 238, 240 of the optical thyristor 220, depending on the wavelength or energy of the radiation 112. The activation portion 218 represents an exposed area of the semiconductor body 200 that receives the radiation 112 from the source 110. The semiconductor body 200 generates electric charge, such as electron-hole pairs, when the radiation 112 is received into the semiconductor body 200 through the activation portion 218. For example, light may be received into the one or more of the layers 204, 206 of the optical thyristor 220. If the light is of sufficient wavelength or energy, then the light may cause electrons to be liberated from one or more atoms of the materials in the layer 204 and/or 206 of the optical thyristor 220. Different wavelengths and/or energies of the light may cause different amounts of electrons to be liberated in the semiconductor body 200. In one embodiment, the light is an ultraviolet (UV) light having a wavelength of between 200 and 450 nanometers. As one example, the light may have a wavelength of approximately 300 nanometers and the semiconductor body 200 may include SiC such that the responsivity of the semiconductor body 200 to the light is approximately 0.14 amps per watt (A/W) when the approximately 300 nanometer wavelength of light is received.

The wavelength or energy of the radiation 112 may determine which of the layers 204, 206 the radiation 112 reaches. For example, light having longer wavelengths may penetrate into the deeper absorption region 238 and/or the second layer 204 while light having shorter wavelengths may penetrate only into the more shallow absorption region 240 and/or the third layer 206 but not into the second layer 204. As described above, the light generates electric charge by separating electrons from atoms in the layer(s) that receive the light. Therefore, changing the wavelength of the light can change where electric charge (e.g., current) is generated in the semiconductor body 200.

A separation distance D between the activation portion 218 and the radiation source 110 may be varied to control the amount of current generated in the layers 204 and/or 206. For example, the separation distance D may be decreased so that the radiation source 110 is disposed closer to the activation portion 218 (e.g., the upper surface of the semiconductor body 200 in the optical thyristor 220) and more radiation 112 is received and/or absorbed by the semiconductor body 200 in the optical thyristor 220. Alternatively, the separation distance D may be increased so that the radiation source 110 is disposed farther from the activation portion 218 and less radiation 112 is received and/or absorbed by the semiconductor body 200 in the optical thyristor 220.

In one embodiment, the semiconductor body 200 is formed from doped layers of SiC and the source 110 generates UV light that is absorbed into the second layer 204 of the optical thyristor 220 to turn the optical thyristor 220 to an ON or conducting state. Once the optical thyristor 220 is turned to the ON (or conducting) state, the light-generated current may be able to flow through the optical thyristor 220.

At least some of the light-generated current can flow from the optical thyristor 220 to the amplifying thyristor 222. For example, some of the current can flow through the portions of the third layer 206 and/or the second layer 204 in the optical thyristor 220 to the portions of the third layer 206 and/or the second layer 204 in the amplifying thyristor 222. A first resistor ($R_O$) is shown in FIG. 2 as representing the resistance to the flow of the light-generated current from one or more of the layers 204, 206 in the optical thyristor 220 to one or more of the layers 204, 206 in the amplifying thyristor 222.

As shown in FIG. 2, a conductive terminal 226 is directly coupled with the amplifying thyristor 222. For example, the conductive terminal 226 may be a conductive layer that is at least partially deposited onto the portion of the fourth layer 208 that is in the amplifying thyristor 222. As described below, the conductive terminal 226 can be conductively coupled with the anode terminal 210 to receive at least some electric current from the power source 102 (shown in FIG. 1) that is conductively coupled with the anode terminal 210.

The current that is received through the conductive terminal 226 may not flow through the amplifying thyristor 222 to the cathode when the amplifying thyristor 222 is not in a conducting state. As described above, the radiation 112 can turn the optical thyristor 220 to an ON state. Some of the current that is generated within the layers 204, 206 of the optical thyristor 220 may flow (e.g., through the resistor ($R_O$) and into the second layer 204 and/or the third layer 206 in the amplifying thyristor 222.

The amount of current received from the optical thyristor 220 may be sufficiently large to turn the amplifying thyristor 222 to an ON or conducting state. When the amplifying thyristor 222 is in the ON state, the current from the conductive terminal 226 may flow through the amplifying thyristor 222 to the cathode. The electrical resistance of the conductive pathway that extends through the conductive terminal 226 is schematically shown in FIG. 2 as a resistor ($R_1$). The amplifying thyristor 222 can increase the amount of current that flows through the semiconductor body 200 between the conductive terminal 226 and the cathode relative to the current that flows through the semiconductor body 200 in the optical thyristor 220. For example, when the amplifying thyristor 222 is in the ON state, at least some of the current supplied by the power source to the anode terminal 210 may flow through the layers 208, 206, 204, 202 of the amplifying thyristor 222 and the magnitude (e.g., voltage) of the current that flows through the amplifying thyristor 222 may be greater than the light-generated current that flows through the optical thyristor 220. However, prior to the optical thyristor 220 switching the amplifying thyristor 222 to the ON state (as described above), no current (or current below a threshold, such as a designated or dynamic threshold) may flow through the amplifying thyristor 222 between the conductive terminal 226 and the cathode.

In the illustrated embodiment, a lower passivation layer 228 is disposed between the conductive terminal 226 and the semiconductor body 200 above and/or between the amplifying thyristor 222 and the switching thyristor 224. The lower passivation layer 228 can include or be formed from a non-conductive material (e.g., dielectric material) and can separate the conductive terminal 226 from the fourth layer 208 and/or the third layer 206 over a portion of the semiconductor body 200. For example, the lower passivation layer 228 spatially separates the conductive terminal 226 from the fourth layer 208 in a portion of the amplifying thyristor 222 and from the fourth layer 208 in an intermediate portion 230 of the semiconductor body 200. As shown in FIG. 2, the intermediate portion 230 is disposed between the amplifying thyristor 222 and the switching thyristor 224. The intermediate portion 230 may have a width dimension 232 in the cross-sectional view of FIG. 2.

An upper passivation layer 236 is disposed on the first side 212 of the semiconductor body 200 in the illustrated embodiment. The upper passivation layer 236 may extend from the conductive terminal 226 to the anode terminal 210. Similar to the lower passivation layer 228, the upper passivation layer 236 may include or be formed from a non-conductive (e.g., dielectric material). The upper passivation layer 236 separates the anode terminal 210 from the conductive terminal 226 such that electric current cannot flow directly from the anode terminal 210 to the conductive terminal 226.

When the amplifying thyristor 222 is in the ON or conducting state, the current flowing from the conductive terminal 226 to the cathode through the layers 208, 206, 204, 202 in the amplifying thyristor 222 also may flow into the third layer 206 of the semiconductor body 200 at or near the interface between the intermediate portion 230 and the switching thyristor 224. For example, as shown in FIG. 2, the fourth layer 208 may be entirely or at least partially removed in the intermediate region 230 of the semiconductor body 200 such that the conductive terminal 226 engages (e.g., directly contacts) the third layer 206 in the intermediate region 230 at or near the interface between the intermediate region 230 and the switching thyristor 224. The current flowing from the conductive terminal 226 to the cathode may flow into the third layer 206 at or near the interface between the intermediate portion 230 and the switching thyristor 224 and act as the activation signal or current for the gate to the switching thyristor 224. For example, the current may flow into the third layer 206 sufficiently close to the switching thyristor 224 that the current flows into the portion of the third layer 206 that is in the switching thyristor 224 and switch the switching thyristor 224 to the ON or conducting state. When the switching thyristor 224 is in the ON or conducting state, the current may flow from the anode terminal 210 to the cathode. For example, the thyristor device 106 may then be switched ON such that the current from the power source can flow through the thyristor device 106 from the anode terminal 210 to the cathode, and then to one or more loads, as described above. In order to switch the thyristor device 106 to the OFF or blocking state, the current supplied across the anode terminal 210 and the cathode is decreased to zero (e.g., no volts).

The inclusion of the amplifying thyristor 222 allows a relatively small current that is optically generated in the optical thyristor 220 to turn the switching thyristor 224 to the ON state. Due to the high current provided to the anode terminal 210 from a power source, the switching thyristor 224 may have a relatively high threshold current that needs to be provided to the gate (e.g., the layers 206 and/or 204) of the switching thyristor 224 to turn the switching thyristor 224 to the ON state. The threshold current may be greater than the current that is generated by exposure of the optical thyristor 220 to the radiation 112. However, the amplifying thyristor 222 can increase the light-generated current from the optical thyristor 220 to a current that is sufficiently large to switch the switching thyristor 224 to the ON state.

For example, in one embodiment, the optical thyristor 220 may be switched to the conducting state by a light-generated current of 0.016 amps or less. The amplifying thyristor structure 222 can increase this current to 1.6 amps or more to switch the switching thyristor 224 to the conducting state. As another example, the optical thyristor 220 may be switched to the conducting state by a light-generated current of 0.013 amps or less. The amplifying thyristor 222 can increase this current to 1.3 amps or more to switch the switching thyristor 224 to the conducting state.

In the illustrated embodiment, an isolation region 234 is provided in the semiconductor body 200 to suppress conduction of electric current between two or more gates of the thyristors 220, 222, 224. For example, the isolation region 234 may be provided to suppress or prevent the flow of current between the gate of the optical thyristor 220 and the gate of the amplifying thyristor 222 and/or the gate of the switching thyristor 224. By "suppress," it is meant that the isolation region 234 may allow some current to flow between the gates of the optical thyristor 220 and one or more of the amplifying thyristor 222 and/or the switching thyristor 224, but the current that is allowed to flow between the gates of the optical thyristor 220 and the amplifying thyristor 222 and/or the switching thyristor 224 is insufficient to switch the optical thyristor 220 to the ON state. For example, the gate of the optical thyristor 220 (e.g., the layers 206 and/or 204) may be associated with a threshold current or charge that is needed to switch the optical thyristor 220 to the ON state. The isolation region 234 may permit current or charge that is less than this threshold current or charge to flow into the gate of the optical thyristor 220. The isolation region 234 can prevent the optical thyristor 220 from inadvertently or unintentionally being switched to the ON state by current or charge that flows back from the anode 210, which may occur in relatively high voltage uses of the thyristor device 106 if the isolation region 234 is not provided.

The isolation region 234 is provided in the illustrated embodiment beneath the lower passivation layer 228 and within the intermediate portion 230 of the semiconductor body 200. For example, the isolation region 232 may be provided in the upper base layer 206 in the intermediate portion 230 of the semiconductor body 200 between the lower passivation layer 228 and the second layer 204 and/or the first layer 202. The isolation region 234 can include a localized change in the amount and/or type of dopants in the semiconductor body 200. For example, the isolation region 234 can be defined by a volume of the third layer 206 that has less dopants or a smaller density of dopants than the remainder of the third layer 206. In one embodiment, the isolation region 234 can be a region of the third layer 206 formed from intrinsic (e.g., undoped) SiC, while the portions of the semiconductor body 200 that surround the isolation region 234 are doped with p- or n-type dopants. In another embodiment, the isolation region 234 can be a region of the third layer 206 that is doped with an oppositely charged dopant than the remainder of the third layer 206. For example, if the third layer 206 is predominantly doped with an n-type dopant, then the isolation region 234 may be a region that is predominantly doped with a p-type dopant. Alternatively, if the third layer 206 is predominantly doped with a p-type dopant, then the isolation region 234 may be predominantly doped with an n-type dopant.

In another embodiment, the isolation region 234 may represent a void (e.g., empty space) in the semiconductor body 200, such as in the third layer 206. Alternatively, the isolation region 234 may represent a region of the semiconductor body 200, such as in the third layer 206, that includes a non-conductive material, such as a dielectric material.

Also as shown in FIG. 2, portions of the fourth layer 208 can be removed between the amplifying thyristor 222 and the switching thyristor 224. For example, the fourth layer 208 may be entirely or at least partially removed in the intermediate portion 230 of the semiconductor body 200. The fourth layer 208 is removed in the illustrated embodiment so as to provide tapered edges 242 that extend from the side 212 of the semiconductor body 200 in the thyristors 222, 224 to the third layer 206 and/or into the third layer 206 (e.g., past or deeper than the first junction $J_1$). Alternatively, the fourth layer 208 may be removed to form another shape. The fourth layer 208 may be removed between the thyristors 222, 224 to restrict or prevent the flow of current through the fourth layer 208 between the thyristors 222, 224 and/or to prevent the flow of current across the first junction $J_1$ in the space between the thyristors 222, 224.

Figure 3:
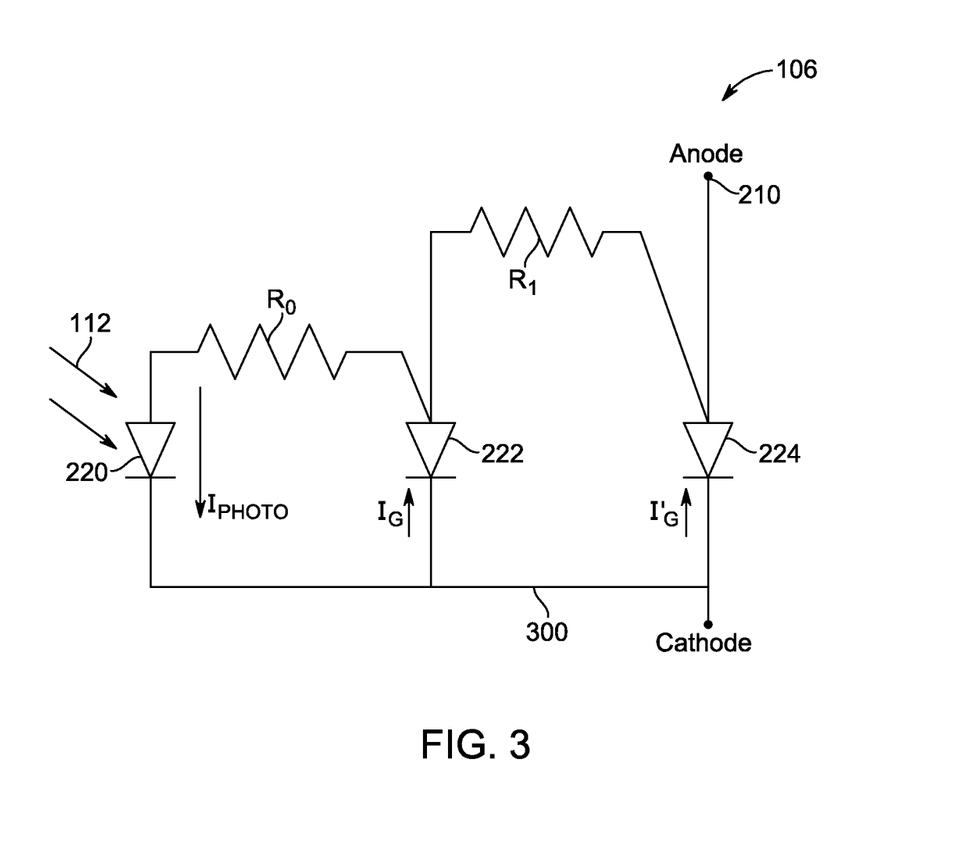
FIG. 3 is a schematic circuit diagram of one embodiment of the thyristor device shown in FIGS. 1 and 2.

FIG. 3 is a circuit diagram of one embodiment of the thyristor device 106 shown in FIGS. 1 and 2. The circuit diagram illustrates a circuit 300 that represents the flow of electric current through the thyristor device 106. The circuit 300 includes the optical thyristor 220 coupled with the amplifying thyristor structure 222 by the resistor ($R_O$). The amplifying thyristor 222 is coupled with the switching thyristor 224 by the resistor ($R_1$). The anode terminal 210 and the cathode are coupled with the switching thyristor 224 such that the switching thyristor 224 controls the flow of electric current from the anode terminal 210 to the cathode.

As shown in FIG. 3, the radiation 112 generates light-generated current ("$I_{PHOTO}$") that switches the optical thyristor 220 from the OFF state to the ON state, as described above. A first gate current ($I_G$) flows from the optical thyristor 220 to the gate of the amplifying thyristor 222 through the resistor ($R_O$) to turn the amplifying thyristor 222 to the ON state, also as described above. A second gate current ($I_G'$), which can be larger than the first gate current ($I_G$) due to amplification by the amplifying thyristor 222, flows from the amplifying thyristor 222 to the gate of the switching thyristor 224 through the resistor ($R_1$) to turn the switching thyristor 224 to the ON state, also as described above. Once the switching thyristor 224 is in the ON state, the current from the anode terminal 210 can flow through the switching thyristor 224 to the cathode.

Figure 4:
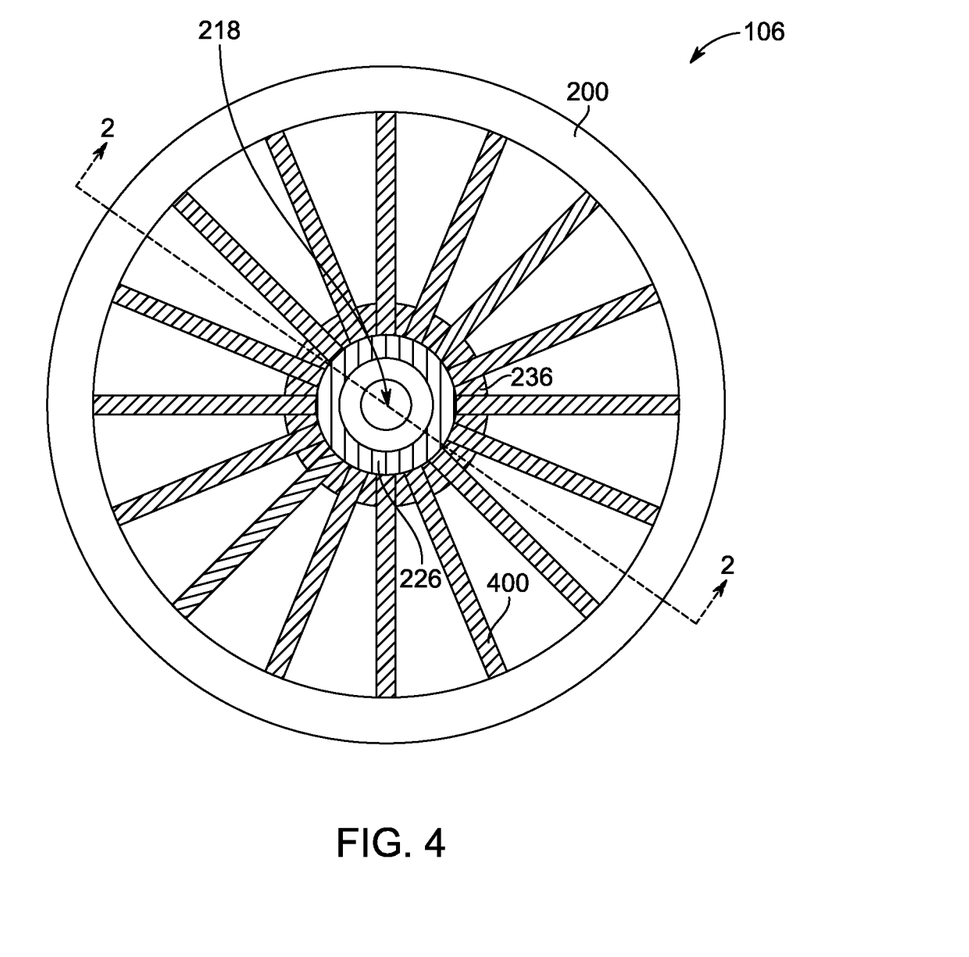
FIG. 4 is a top view of one embodiment of the thyristor device shown in FIG. 2.

FIG. 4 is a top view of one embodiment of the thyristor device 106, with a line 2-2 indicating the location of the cross-sectional view of the thyristor device 106 shown in FIG. 2. As described above, the thyristor device 106 may have a cylindrical shape. Alternatively, the thyristor device 106 may have another shape. In the illustrated embodiment, the activation portion 218 of the semiconductor body 200 (shown in FIG. 2) is disposed at the center, or core, of the thyristor device 106. The conductive terminal 226 is provided as a conductive ring that extends around the activation portion 218. For example, the conductive terminal 226 may circumferentially extend around the entire periphery of the activation portion 218. Alternatively, the conductive terminal 226 may extend around part, but not all, of the activation portion 218.

In the view shown in FIG. 4, the lower passivation layer 228 (shown in FIG. 2) is not visible because the lower passivation layer 228 is disposed beneath the conductive terminal 226. However, the lower passivation layer 228 may be provided as a non-conductive (e.g., dielectric) ring that extends around the activation portion 218 beneath the conductive terminal 226. For example, the lower passivation layer 228 may circumferentially extend around the entire periphery of the activation portion 218 beneath the conductive terminal 226. Alternatively, the lower passivation layer 228 may extend around part, but not all, of the activation portion 218 beneath the conductive terminal 226.

The upper passivation layer 236 is provided as a conductive ring that extends around the conductive terminal 226. For example, the upper passivation layer 236 may circumferentially extend around the entire periphery of the conductive terminal 226. Alternatively, the upper passivation layer 236 may extend around part, but not all, of the conductive terminal 226.

The anode terminal 210 extends around the upper passivation layer 236 in the illustrated embodiment. The anode terminal 210 may be provided as a conductive ring that extends around all, or at least a portion, of the outer periphery of the upper passivation layer 236. Alternatively, the anode terminal 210 may not extend around the periphery of the upper passivation layer 236, such as when the anode terminal 210 is provided in only a discrete section of the first side 212 of the semiconductor body 200. As shown in FIG. 3, an outer portion of the semiconductor body 200 extends outside of the anode terminal 210. Alternatively, this exposed portion of the semiconductor body 200 may represent an outer housing of the device 106. In the illustrated embodiment, the exposed portion of the semiconductor body 200, the anode terminal 210, the upper passivation layer 236, and/or the conductive terminal 226 form multiple concentric rings with the activation portion 218 disposed at the center of the rings. Alternatively, one or more of the semiconductor body 200, the anode terminal 210, the upper passivation layer 236, and/or the conductive terminal 226 form another shape and/or the activation portion 218 may be disposed elsewhere.

Conductive bridges 400 extend from the anode terminal 210 to the conductive terminal 226. The conductive bridges 400 may include elongated conductive bodies (e.g., busses, conductive fingers, and the like) that are conductively coupled with the anode terminal 210 and with the conductive terminal 226. The conductive bridges 400 may not engage or be coupled with the semiconductor body 200 between the anode terminal 210 and the conductive terminal 226 in one embodiment. For example, the conductive bridges 400 may be spaced apart from the semiconductor body 200 by one or more passivation layers, other nonconductive bodies, or by space (e.g., a void between the conductive bridges 400 and the semiconductor body 200).

The conductive bridges 400 conduct electric current from the anode terminal 210 to the conductive terminal 226 to aid in amplifying the current that flows through the amplifying thyristor 222 and/or that flows to the gate of the switching thyristor 224. The conductive bridges 400 are shown as radially extending elongated bodies, but alternatively may have other shapes and/or may not radially extend from the conductive terminal 226. The size and/or number of conductive bridges 400 shown in FIG. 4 are provided as one example. Alternatively, the number and/or size of conductive bridges 400 may be changed to control the amount of current that flows from the anode terminal 210 to the conductive terminal 226. For example, the number and/or size can be increased to increase the amount of current that flows to the conductive terminal, or the number and/or size can be decreased to decrease this amount of current. The conductive bridges 400 may be equally distributed around the activation portion 218 of the semiconductor body 200. For example, neighboring conductive bridges 400 may be disposed at approximately equal radians or angles from each other around the activation portion 218.

Figure 5:
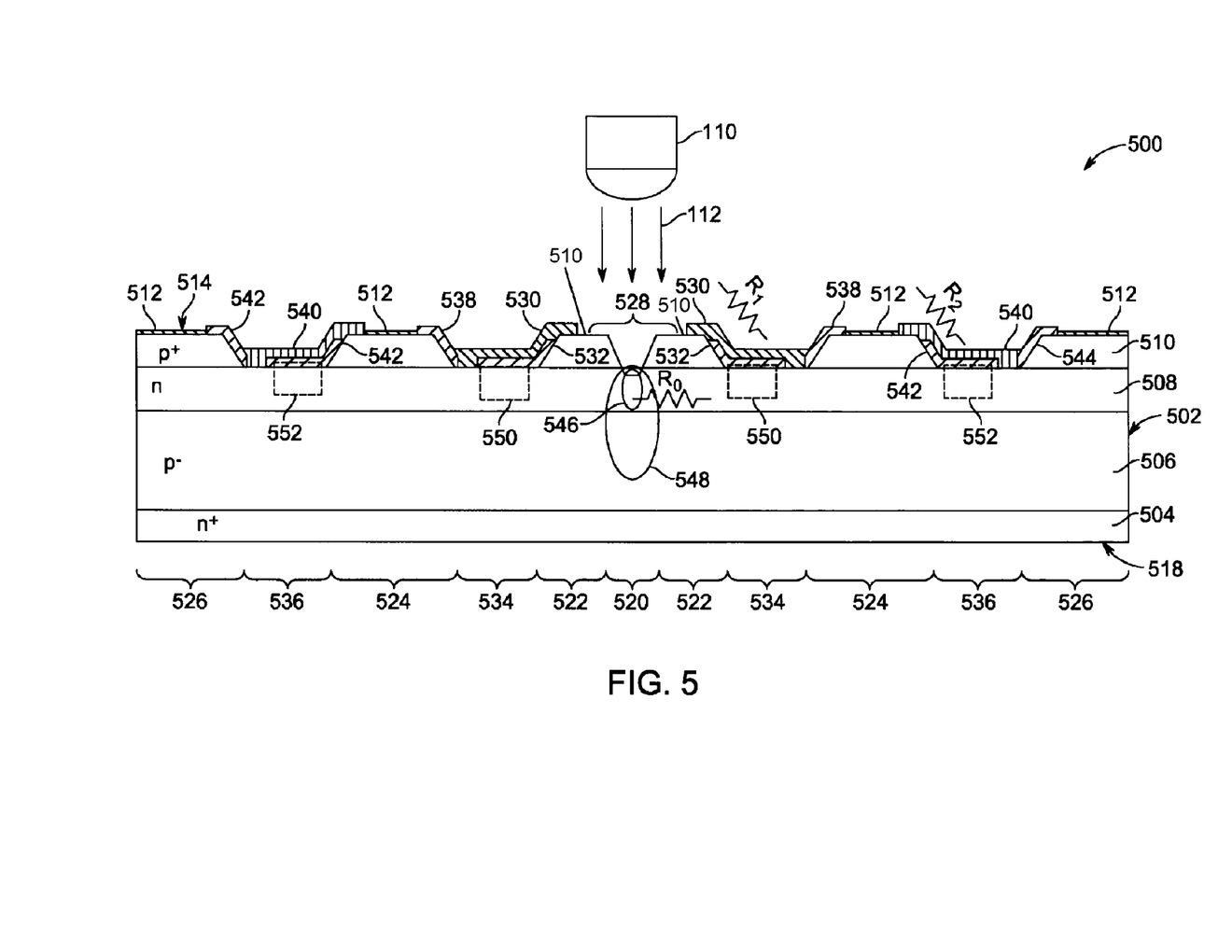
FIG. 5 is a cross-sectional view of another embodiment of the thyristor device shown in FIG. 1.

FIG. 5 is a cross-sectional view of another embodiment of a thyristor device 500. The thyristor device 500 may be used as one or more of the thyristor devices 106 shown in FIG. 1. The thyristor device 500 includes a semiconductor body 502 that may be similar to the semiconductor body 200 shown in FIG. 2. For example, the semiconductor body 502 may have or be formed from several alternating doped layers 504, 506, 508, 510 that can be similar to the doped layers 202, 204, 206, 208 shown in FIG. 2.

A conductive anode 512 is deposited on a first side 514 of the semiconductor body 502 and a conductive cathode 516 is deposited on an opposite, second side 518 of the semiconductor body 502 in the illustrated embodiment. Alternatively, the conductive cathode 516 may not be provided and the first layer 504 may be the cathode. The anode 512 may be conductively coupled with a power source, such as the power source 102 (shown in FIG. 1). The cathode 516 may be conductively coupled with a load, such as the load 104 (shown in FIG. 1). Alternatively, the anode 512 may be conductively coupled with the load while the cathode 516 is conductively coupled with the power source.

The layers 504, 506, 508, 510 form four layer thyristor structures that are optically switched ON. The thyristor device 500 can be effectively divided into several such four layer structures, such as an optical thyristor 520, a first amplifying thyristor 522, a second amplifying thyristor 524, and a switching thyristor 526. The thyristors 520, 522, 524, 526 are electrically coupled in parallel with each other, as described below. The thyristors 520, 522, 524, 526 may represent thyristors that are electrically coupled in parallel with each other. In the illustrated embodiment, the thyristors 522 and 524 are separated from each other by an inner intermediate portion 534 of the semiconductor body 502 and the thyristors 524 and 526 are separated from each other by an outer intermediate portion 536.

Similar to the thyristor device 106 shown in FIG. 2, in the illustrated embodiment, the thyristors 520, 522, 524, 526 are symmetric in the body 502 as the thyristors 522, 524, 526 may be disposed on opposite sides of the optical thyristor 520. The thyristor device 500 may be formed as a cylindrical-shaped device with the optical thyristor 520 disposed at or near the center or core of the cylindrical-shaped device and the thyristors 522, 524, 526 circumferentially surrounding the optical thyristor 520 at different radial distances from the optical thyristor 520 or otherwise disposed outside of the optical thyristor 520. Alternatively, the thyristors 522, 524, 526 may not be disposed symmetrically around the optical thyristor 520. For example, one or more the thyristors 522, 524, 526 may be disposed only on one side of the optical thyristor 520.

The optical thyristor 520 may be similar to the optical thyristor 220 shown in FIG. 2. For example, the optical thyristor 520 may generate an electric current in one or more of the layers 506 and/or 508 in the optical thyristor 520 when the radiation 112 (e.g., light or UV light) from the radiation source 110 (e.g., an LED) is received through an activation portion 528 of the semiconductor body 502. The radiation 112 can be absorbed by the semiconductor body 502 in one or more radiation or light absorption regions 546, 548 of the optical thyristor 520, depending on the wavelength or energy of the radiation 112, as described above. Also as described above in connection with the thyristor device 106 (shown in FIG. 1), the radiation-generated current can switch the optical thyristor 520 to an ON or conducting state.

The current generated in the optical thyristor 520 by the radiation 112 can flow through one or more of the layers 506 and/or 508 to the first amplifying thyristor 522. A resistor ($R_O$) is shown in FIG. 5 as representing the resistance to the flow of the radiation-generated current from one or more of the layers 506 and/or 508 in the optical thyristor 520 to one or more of the layers 506 and/or 508 in the first amplifying thyristor 522.

An inner conductive terminal 530 that is similar to the conductive terminal 226 (shown in FIG. 2) may be directly coupled with the first amplifying thyristor 522. For example, the inner conductive terminal 530 may be a conductive layer that is at least partially deposited onto the portion of the upper layer 510 of the semiconductor body 502 that is in the first amplifying thyristor 522. The inner conductive terminal 530 can be conductively coupled with the anode 512 (e.g., by one or more conductive bridges that are similar to the conductive bridges 400 shown in FIG. 4) to receive at least some electric current from the power source that is conductively coupled with the anode 512.

The current that is received through the inner conductive terminal 530 may flow through the first amplifying thyristor 522 after the radiation-generated current turns the optical thyristor 520 and the first amplifying thyristor 522 to the ON state, as described above. When the first amplifying thyristor 522 is in the ON state, the current that flows from the anode 512 and through the inner conductive terminal 530 may flow through the first amplifying thyristor 522 to the cathode 516. The electrical resistance of the conductive pathway that extends through the inner conductive terminal 530 is schematically shown in FIG. 5 as a resistor $R_1$.

An inner lower passivation layer 532 is disposed between the first conductive terminal 530 and the semiconductor body 502, similar to the lower passivation layer 228 shown in FIG. 2. An inner upper passivation layer 538 is disposed on the first side 514 of the semiconductor body 502 in the illustrated embodiment, similar to the upper passivation layer 236 shown in FIG. 2.

When the first amplifying thyristor 522 is in the ON or conducting state, the current flowing from the inner conductive terminal 530 to the cathode 516 through the first amplifying thyristor 522 also may flow into the upper base layer 508 of the semiconductor body 502 at or near the interface between the inner intermediate portion 534 and the second amplifying thyristor 524, similar to as described above in connection with the amplifying thyristor 222 and the switching thyristor 224. The current flowing from the inner conductive terminal 530 to the cathode 516 may flow into the upper base layer 508 at or near the interface between the inner intermediate portion 534 and the second amplifying thyristor 524 and act as the activation signal or current for the gate to second amplifying thyristor structure 524. When the second amplifying thyristor 524 is in the ON or conducting state, current may flow through the second amplifying thyristor 524 from the anode 512 to the cathode 516.

An outer conductive terminal 540 that may be similar to the inner conductive terminal 530 can be provided between the second amplifying thyristor 524 and the switching thyristor 526. The outer conductive terminal 540 is conductively coupled with the anode 512 above the second amplifying thyristor 524, as shown in FIG. 5. For example, the outer conductive terminal 540 may engage the anode 512 above the second amplifying thyristor 524. The conductive pathway provided by the outer conductive terminal 540 is schematically shown in FIG. 5 as a resistor ($R_2$). At least some of the current flowing through the anode 512 and/or the second amplifying thyristor 524 also may flow through the outer conductive terminal 540. This current may flow to the upper base layer 508 in the outer intermediate region 536 at or near the interface between the outer intermediate region 536 and the switching thyristor 526. An outer lower passivation layer 542 that may be similar to the inner lower passivation layer 532 may be provided between the outer conductive terminal 540 and at least some of the semiconductor body 502 in the outer intermediate region 536, as shown in FIG. 5.

An outer lower passivation layer 542 is disposed between the conductive terminal 540 and the semiconductor body 502, similar to the lower passivation layer 228 shown in FIG. 2. An outer upper passivation layer 544 is disposed on the first side 514 of the semiconductor body 502 in the illustrated embodiment, similar to the upper passivation layer 236 shown in FIG. 2.

The current that flows into the upper base layer 508 may be increased by the current flowing from the anode 512 when the second amplifying thyristor structure 524 is in the ON state. This current can flow into the gate of the switching thyristor structure 526 (e.g., the upper base layer 508) to turn the switching thyristor structure 526 to the ON or conducting state, similar to as described above in connection with the switching thyristor structure 224. The switching thyristor 526 may then permit current to flow from the anode 512 disposed above the switching thyristor 526 to the cathode 516 disposed below the switching thyristor 526. When the switching thyristor 526 is in the ON state, the thyristor device 500 may be in the ON state such that the current from the power source can flow through the thyristor device 500 from the anode 512 to the cathode 516, and then to one or more loads, as described above. In order to switch the thyristor device 500 to the OFF or blocking state, the current supplied across the anode and cathode may be cut off, or reduced, below a threshold or reduced to zero, as described above.

The inclusion of the amplifying thyristor 522, 524 can allow a relatively small current that is optically generated in the optical thyristor 520 to turn the switching thyristor 526 to the ON state. As described above, due to the high voltage provided to the anode 512 from a power source, the switching thyristor 526 may have a relatively high threshold current that is needed to be provided to the gate of the switching thyristor 526 to turn and hold the switching thyristor 526 to the ON state. The threshold current may be greater than the current that is generated by exposure of the optical thyristor 520 to the radiation 112 and/or that flows through the first amplifying thyristor 522. However, the second amplifying thyristor 524 can increase the current from the first amplifying thyristor 522 to a current that is sufficiently large to switch the switching thyristor 526 to the ON state.

For example, in one embodiment, a light-generated current of 0.016 amps or less may switch the optical thyristor 520 to the conducting state. The first amplifying thyristor 522 can increase this current to 1.6 amps or more and the second amplifying thyristor 524 can increase the current to 16 amps or more to switch the switching thyristor 526 to the conducting state. As another example, a light-generated current of 0.013 amps or less may switch the optical thyristor 520 to the conducting state. The first amplifying thyristor 522 can increase this current to 1.3 amps or more and the second amplifying thyristor 524 can increase the current to 13 amps or more to switch the switching thyristor 526 to the conducting state.

Similar to the thyristor device 106 shown in FIG. 2, the thyristor device 500 can include isolation regions 550, 552 in the semiconductor body 502 to suppress conduction of electric current between two or more gates of the thyristors 520, 522, 524, 526. The isolation regions 550, 552 can be similar to the isolation regions 234 shown in FIG. 2 and described above. For example, the inner and/or outer isolation regions 550, 552 may be provided to suppress or prevent the flow of current between the gate of the optical thyristor 520 and the gates of one or more of the amplifying thyristor 522, 524 and/or the switching thyristor 526. As described above, suppressing this current can prevent one or more of the thyristors 520, 522, 524, 526 from being inadvertently switched to the ON state, such as when no radiation 112 is directed into the activation portion 526 of the optical thyristor 520.

Figure 6:
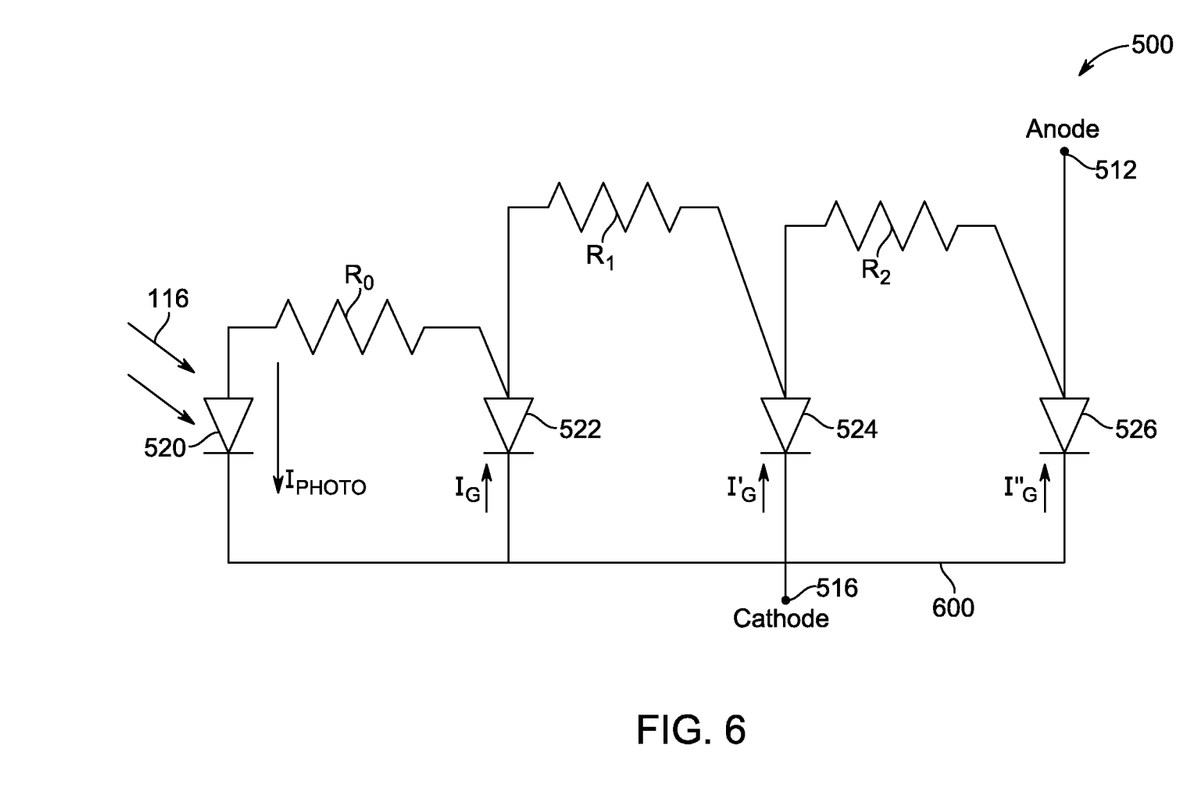
FIG. 6 is a schematic circuit diagram of one embodiment of the thyristor device shown in FIG. 5.

FIG. 6 is a circuit diagram of one embodiment of the thyristor device 500 shown in FIG. 5. The circuit diagram illustrates a circuit 600 that represents the flow of electric current through the thyristor device 500. The circuit 600 includes the optical thyristor structure 520 coupled with the first amplifying thyristor 522 by the resistor ($R_0$). The first amplifying thyristor 522 is coupled with the second amplifying thyristor 524 by the resistor ($R_1$). The second amplifying thyristor 524 is coupled with the switching thyristor 526 by the resistor ($R_2$). The anode 512 and the cathode 516 are coupled with the switching thyristor 526 such that the switching thyristor 526 controls the flow of electric current from the anode 512 to the cathode 516.

As shown in FIG. 6, the light 116 generates radiation-generated current (e.g., light-generated current, or "$I_{PHOTO}$") that switches the optical thyristor 520 from the OFF state to the ON state, as described above. A first gate current ($I_G$) flows from the optical thyristor 520 to the gate of the first amplifying thyristor 522 through the resistor ($R_0$) to turn the first amplifying thyristor 222 to the ON state.

A second gate current ($I_G'$), which can be larger than the first gate current ($I_G$) due to amplification by the first amplifying thyristor 522, flows from the first amplifying thyristor 522 to the gate of the second amplifying thyristor 524 through the resistor ($R_1$) to turn the second amplifying thyristor 524 to the ON state.

A third gate current ($I_G''$), which can be larger than the second gate current ($I_G'$) due to amplification by the second amplifying thyristor 524, flows from the second amplifying thyristor 522 to the gate of the switching thyristor 526. This third gate current ($I_G''$) switches the switching thyristor 526 to the ON state, as described above. Once the switching thyristor 526 is in the ON state, the current from the anode 512 can flow through the switching thyristor 526 to the cathode 516.

The use of the amplification thyristors 522, 524 increases the light-generated gate current ($I_{PHOTO}$) to the second gate current ($I_G''$) so that the second gate current ($I_G''$) is large enough to switch the switching thyristor 526 to the ON state. The radiation generated gate current ($I_{PHOTO}$), the first gate current ($I_G'$), and/or the second gate current ($I_G''$) may be insufficient to switch the switching thyristor 526 to the ON state. If additional amplifying thyristors are needed to increase the gate currents to an amount that is sufficiently large to switch the switching thyristor 526 to the ON state, more amplifying thyristors can be provided between the optical thyristor 520 and the switching thyristor 526, similar to as described above in connection with the thyristor devices 106 and 500.

Figure 7:
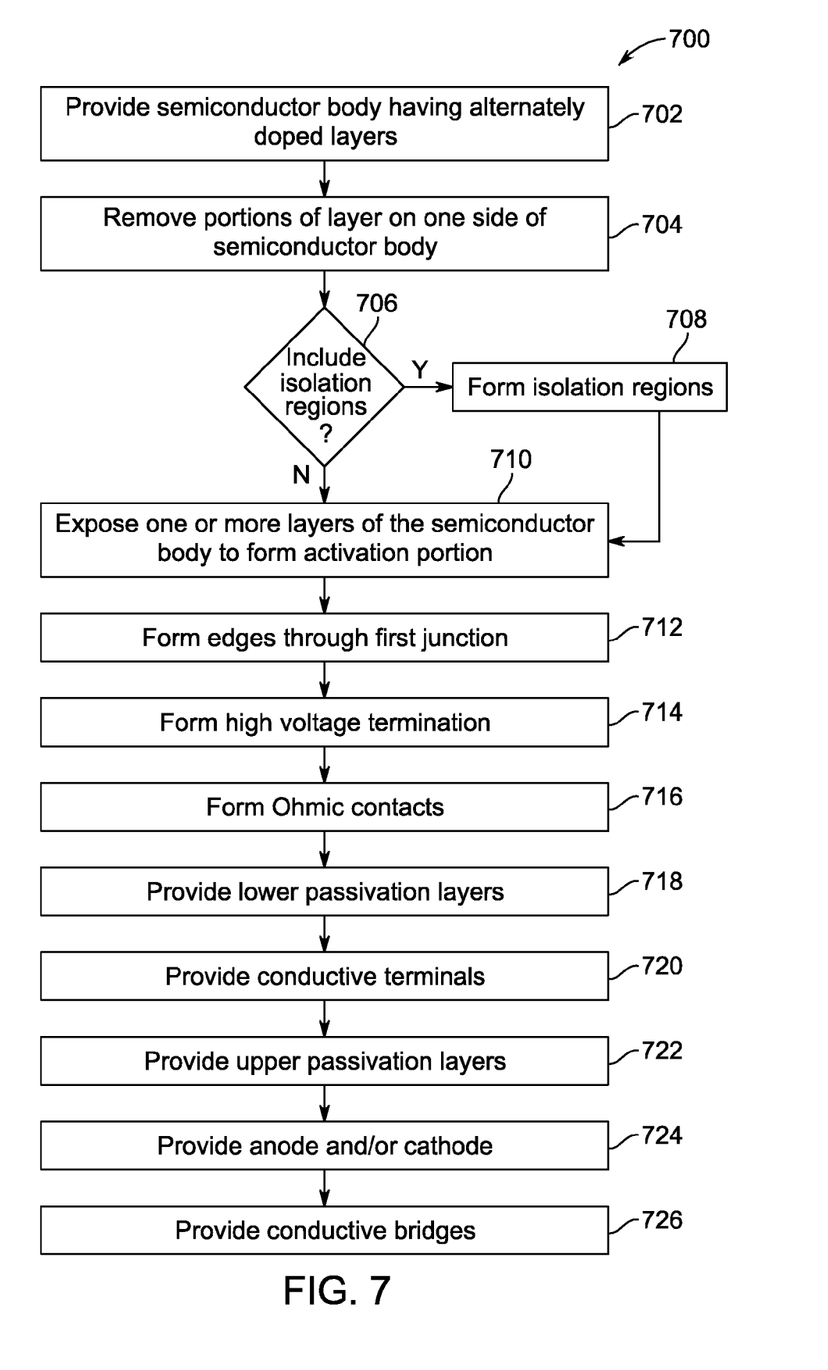
FIG. 7 is a flowchart of one embodiment of a method for providing a thyristor device.

FIG. 7 is a flowchart of one embodiment of a method 700 for providing a thyristor device. The method 700 may be used for providing the thyristor device 106 shown in FIG. 1. Reference is made to the thyristor devices 106, 500 shown in FIGS. 2 and 5 in the description of the method 700, although the method 700 is not limited to only forming the devices 106, 500 shown in FIGS. 2 and 5.

At 702, the semiconductor body 200, 502 is provided. The semiconductor body 200, 502 may be provided as a semiconductor wafer (e.g., a SiC wafer) that is a substrate that forms the first layer 202, 504 and the other layers 204, 206, 208 or 506, 508, 510 established as specified for doping type, concentration, and thickness on the layer 202 or 504. The layers that are grown or deposited onto the layer 202 or 504 include the first layer 204, 506 (which also can be referred to as a lower base layer), the layer 206, 508 (which also can be referred to as an upper base layer), and the layer 208, 510 (which also can be referred to as an anode layer). These layers may be deposited directly onto layer or substrate 202, 504 using epitaxy growth such as chemical vapor deposition (CVD).

At 704, portions of the fourth layer 208, 510 (e.g., the anode layer) are removed. For example, the fourth layer 208, 510 can be patterned and taper etched through in selected regions to expose the layer 206, 508 in the intermediate portions 230, 534, 536, as shown in FIGS. 2 and 5. In one embodiment, portions of the fourth layer 208, 510 also may be removed in the optical thyristor 220, 520 in order to expose the semiconductor body 200, 502 in the activation portions 218, 528 when the portions of the fourth layer 208, 510 are removed in the intermediate portions 230, 534, 536.

Alternatively, removing the fourth layer 208, 510 to expose the semiconductor body 200, 502 (e.g., the layers 206, 508) in the activation portions 218, 528 may be performed after the portions of the fourth layer 208, 510 are removed in the intermediate portions 230, 534, 536. For example, forming an optical window (e.g., the activation portions 218, 528) may involve a second etch of the layer 208, 510 as the shape and depth of the optical window may be different than upper base contact regions (e.g. the portions 230, 534, 536).

At 706, a determination is made as to whether one or more isolation regions 234, 550, 552 are to be provided. If the isolation regions 234, 550, 552 are not to be provided, flow of the method 700 proceeds to 710. On the other hand, if the isolation regions 234, 550, 552 are to be provided, flow of the method 700 proceeds to 708.

At 708, a second masking layer can be applied to allow for further etching or counter doping of the layer 508 in the areas of the semiconductor body 200, 502 that was exposed at 704 in the intermediate portions 230, 534, 536. The counter doping can be performed using ion implantation.

At 710, the optical window (e.g., the activation portion 218, 528) can be patterned and etched to expose the layer 206, 508 of the semiconductor body 200, 502. This may involve partial removal of the layer 208, 510, as shown in FIGS. 2 and 5, to allow sufficient optical coupling without excessive absorption of the radiation 112.

At 712, edges are formed through the top side 212, 514 of the semiconductor body 200, 502. For example, tapered edges may be patterned and etched through or to the upper base layer 206, 508 to create the tapered edges 242 (and similar edges in the device 500) through junctions $J_1$ and $J_2$, as shown in FIGS. 2 and 5. This fabrication sequence forms an upper base mesa which can isolates the active area (e.g., current carrying region) of the thyristor from the outside periphery of the thyristor device.

At 714, a high voltage termination surrounding the second junction $J_2$ (which may be referred to as a blocking junction). The termination may be provided by pattern and implant for JTE attached to the second junction $J_2$ and a fieldstop implant along an outer periphery of the semiconductor body 200, 502. Alternatively, the operations described in connection with 714 may not be performed.

At 716, Ohmic contacts are formed with the upper base layers 206, 508. For example, a pattern and implant sequence may be performed to put an N+ doped area into the exposed upper base layer 206, 508 in the intermediate portions 230, 534, 536. Alternatively, another type or concentration of a doped area can be provided. The doped area forms a relatively low resistance Ohmic contact to the upper base layer 206, 508 where conductive terminal 226, 530, 540 contacts the exposed surface of the upper base layer 206, 508.

At 718, lower passivation layers are provided above the semiconductor body 200, 502 formed by the layers 202, 204, 206, 208, 504, 506, 508, 510. For example, the lower passivation layers 228, 532, 542 may be selectively deposited on the semiconductor bodies 200, 502 as shown in FIGS. 2 and 5. The lower passivation layers 228, 532, 542 may be formed from a non-conductive (e.g., dielectric) material, such as silicon dioxide or silicon nitride. The lower passivation layers 228, 532, 542 can be deposited on the selected areas by using one or more removable masks or other capping layers that limit where the materials for the lower passivation layers 228, 532, 542 are deposited. Alternatively, the lower passivation layers 228, 532, 542 can be deposited and selectively etched to form the shapes shown in FIGS. 2 and 5.

At 720, conductive terminals are provided above intermediate regions of the semiconductor body between the structures. For example, the conductive terminals 226, 530, 540 may be selectively deposited on the semiconductor bodies 200, 502 to create conductive pathways between the amplifying thyristor structures 222, 522, 524 and/or between the amplifying thyristor structures 222, 522, 524 and the switching thyristor structures 224, 524. The conductive terminals 226, 530, 540 may be deposited by sputtering or otherwise depositing metal or other conductive materials on portions of the semiconductor bodies 200, 502 that are exposed through a removable mask or capping layer that can be later removed. Alternatively, the conductive terminals 226, 530, 540 may be deposit and selectively etched to form the shapes shown in FIGS. 2 and 5. The terminations of the conductive paths must form ohmic contacts to the semiconductor regions they link (e.g. upper base and anode)

At 722, upper passivation layers are provided above the semiconductor body 200, 502. For example, the upper passivation layers 236, 538, 542 may be selectively deposited on the semiconductor bodies 200, 502 as shown in FIGS. 2 and 5. The upper passivation layers 236, 538, 542 may be formed from a non-conductive (e.g., dielectric) material, such as silicon dioxide or silicon nitride. The upper passivation layers 236, 538, 542 can be deposited on the selected areas by using one or more removable masks or other capping layers that limit where the materials for the upper passivation layers 236, 538, 542 are deposited. Alternatively, the upper passivation layers 236, 538, 542 can be deposited and selectively etched to form the shapes shown in FIGS. 2 and 5.

At 724, the anode and cathode are provided on the semiconductor bodies. For example, the anode 210, 512 and the cathode 214, 516 may be deposited as conductive materials (e.g., metal or other conducting materials) on portions of the top sides 212, 514 and bottom sides 216, 518, respectively, of the semiconductor bodies 200, 502.

At 726, conductive bridges are provided between the anode and the conductive terminals. For example, the conductive bridges 400 (or conductive bodies similar to the conductive bridges 400) may be provided such that the conductive bridges 400 are conductively coupled with the anode 210, 512 and the conductive terminals 226, 530, 540, as described above. The conductive bridges 400 may be provided by selectively depositing conductive material on areas where the conductive bridges 400 will be provided. Alternatively, the conductive bridges 400 may be provided by depositing conductive material over the top side of the thyristor devices 110, 500 and then selectively etching the conductive bridges 400. In another embodiment, the conductive bridges 400 may be provided by coupling conductive bodies (e.g., bus, wire, and the like) to the anode 210, 512 and the conductive terminals 226, 530, 540.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. While the dimensions and types of materials described herein are intended to define the parameters of the inventive subject matter, they are by no means limiting and are exemplary embodiments. Many other embodiments will be apparent to one of ordinary skill in the art upon reviewing the above description. The scope of the subject matter described herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose several embodiments of the inventive subject matter, including the best mode, and also to enable any person of ordinary skill in the art to practice the embodiments disclosed herein, including making and using any devices or systems and performing any incorporated methods. The patentable scope of the subject matter is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present inventive subject matter are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

What is claimed is:

1. A device comprising:
a semiconductor body having a plurality of doped layers forming a plurality of dopant junctions, the semiconductor body including an optically triggered thyristor, a first amplifying thyristor, and a switching thyristor; and
a conductive anode disposed on a first side of the semiconductor body, wherein the optically triggered thyristor is configured to receive incident radiation to generate a first electric current, and the first amplifying thyristor is configured to increase the first electric current from the optically triggered thyristor to at least a threshold current, and wherein the switching thyristor switches to the conducting state in order to conduct a second electric current from the anode and through the semiconductor body; and
a conductive terminal coupled with the first amplifying thyristor and a conductive bridge that is conductively coupled with the anode and the conductive terminal, the conductive terminal configured to conduct at least some of the second electric current from the anode to the first amplifying thyristor to increase the first electric current up to at least the threshold current.

2. The device of claim 1, wherein the semiconductor body includes a first isolation region disposed between the optically triggered thyristor and at least one of the first amplifying thyristor or the switching thyristor, the first isolation region configured to prevent the second electric current flowing from the anode from switching the optically triggered thyristor to the conducting state by suppressing conduction of the second electric current.

3. The device of claim 2, wherein the switching thyristor includes a first gate that is configured to receive the first electric current and turn the optically triggered thyristor to the conducting state, and the first isolation region is configured to suppress conduction of the second electric current from the anode to the first gate.

4. The device of claim 2, wherein the doped layers of the semiconductor body include a first layer doped with a first dopant, a second base layer doped with an oppositely charged, second dopant and coupled with the first layer, a third base layer doped with the first dopant and coupled with the second base layer, and a fourth layer doped with the second dopant and coupled with the third base layer and the anode, and wherein the first isolation region is disposed within the third base layer between the first amplifying thyristor and the switching thyristor.

5. The device of claim 2, wherein the first isolation region is disposed in a layer of the semiconductor body that is doped with a first dopant and the first isolation region includes a volume of the layer that is doped with an oppositely charged second dopant.

6. The device of claim 2, wherein the first isolation region is disposed in a layer of the semiconductor body that is doped with a first dopant and the first isolation region is a void in the layer.

7. The device of claim 2, wherein the first isolation region is disposed in a layer of the semiconductor body that is doped with a first dopant and the first isolation region is a volume in the layer that is filled with a dielectric material.

8. The device of claim 1, wherein the semiconductor body includes a second amplifying thyristor disposed between the first amplifying thyristor and the switching thyristor, the second amplifying thyristor and the first amplifying thyristor configured to increase the first electric current from the optically triggered thyristor structure to at least the threshold current.

9. The device of claim 1, wherein the threshold current is a designated current.

10. A device comprising:
an optically triggered thyristor configured to generate an electric current when exposed to radiation;
an amplifying thyristor having a first gate and configured to switch to the conducting state when the first gate receives at least a first threshold current; and
a switching thyristor having a second gate and coupled with an anode and a cathode, the switching thyristor configured to switch to the conducting state when the second gate receives at least a second threshold current, wherein the optically triggered thyristor is configured to generate the electric current for the first gate that exceeds the first threshold current of the amplifying thyristor and the amplifying thyristor is configured to increase the electric current such that the electric current exceeds the second threshold current of the switching thyristor and is provided to the second gate; and further wherein the amplifying thyristor is coupled with the anode and configured to receive external electric current from a power source through the anode in order to increase the electric current to above the second threshold current.

11. The device of claim 10, wherein the optically triggered thyristor, the amplifying thyristor, and the switching thyristor are disposed in a common semiconductor body, and further comprising an isolation region in the semiconductor body between an optical gate of the optically triggered thyristor and at least one of the first gate or the second gate, the isolation region configured to suppress conduction of the electric current toward the optical gate.

12. The device of claim 11, wherein the isolation region includes at least one of a volume in the semiconductor body that is doped with an oppositely charged dopant relative to a layer in the semiconductor body in which the isolation region is located or a void in the semiconductor body.

13. A device comprising:
a semiconductor body having a plurality of doped layers forming a plurality of dopant junctions, the semiconductor body including an optically triggered thyristor, a first amplifying thyristor, and a switching thyristor; and
a conductive anode disposed on a first side of the semiconductor body, wherein the optically triggered thyristor is configured to receive incident radiation to generate a first electric current, and the first amplifying thyristor is configured to increase the first electric current from the optically triggered thyristor to at least a threshold current, and wherein the switching thyristor switches to the conducting state in order to conduct a second electric current from the anode and through the semiconductor body, and further wherein the semiconductor body includes a first isolation region disposed between the optically triggered thyristor and at least one of the first amplifying thyristor or the switching thyristor, the first isolation region configured to prevent the second electric current flowing from the anode from switching the optically triggered thyristor to the conducting state by suppressing conduction of the second electric current, and further wherein the first isolation region is disposed in a layer of the semiconductor body that is doped with a first dopant and the first isolation region is a volume in the layer that is filled with a dielectric material.

14. The device of claim 13, wherein the switching thyristor includes a first gate that is configured to receive the first electric current and turn the optically triggered thyristor to the conducting state, and the first isolation region is configured to suppress conduction of the second electric current from the anode to the first gate.

15. The device of claim 13, wherein the doped layers of the semiconductor body include a first layer doped with a first dopant, a second base layer doped with an oppositely charged, second dopant and coupled with the first layer, a third base layer doped with the first dopant and coupled with the second base layer, and a fourth layer doped with the second dopant and coupled with the third base layer and the anode, and wherein the first isolation region is disposed within the third base layer between the first amplifying thyristor and the switching thyristor.

16. The device of claim 13, wherein the first isolation region is disposed in a layer of the semiconductor body that is doped with a first dopant and the first isolation region includes a volume of the layer that is doped with an oppositely charged second dopant.

17. The device of claim 13, wherein the first isolation region is disposed in a layer of the semiconductor body that is doped with a first dopant and the first isolation region is a void in the layer.

18. The device of claim 13, wherein the semiconductor body includes a second amplifying thyristor disposed between the first amplifying thyristor and the switching thyristor, the second amplifying thyristor and the first amplifying thyristor configured to increase the first electric current from the optically triggered thyristor structure to at least the threshold current.

19. The device of claim 13, wherein the threshold current is a designated current.

* * * * *